US011407063B2

United States Patent
Kinoshita

(10) Patent No.: US 11,407,063 B2
(45) Date of Patent: Aug. 9, 2022

(54) PROTECTIVE FILM FORMING AGENT AND METHOD FOR PRODUCING SEMICONDUCTOR CHIP

(71) Applicant: TOKYO OHKA KOGYO CO., LTD., Kawasaki (JP)

(72) Inventor: Tetsuro Kinoshita, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 208 days.

(21) Appl. No.: 16/935,819

(22) Filed: Jul. 22, 2020

(65) Prior Publication Data
US 2021/0031300 A1 Feb. 4, 2021

(30) Foreign Application Priority Data
Jul. 30, 2019 (JP) .............................. JP2019-140240

(51) Int. Cl.
| | | |
|---|---|---|
| *B23K 26/066* | (2014.01) | |
| *B23K 26/40* | (2014.01) | |
| *B23K 26/364* | (2014.01) | |
| *B23K 101/40* | (2006.01) | |

(52) U.S. Cl.
CPC .......... *B23K 26/066* (2015.10); *B23K 26/364* (2015.10); *B23K 26/40* (2013.01); *B23K 2101/40* (2018.08)

(58) Field of Classification Search
CPC .... B23K 26/066; B23K 26/364; B23K 26/40; B23K 2101/40; H01L 2221/68327; H01L 2221/6834; H01L 21/67132; H01L 21/6836; H01L 221/67092; H01L 21/3065; H01L 21/78; C09D 101/284; C09D 7/63; C09D 5/00; C09D 7/20; C09D 201/00; C07C 49/172; C07C 211/44
See application file for complete search history.

(56) References Cited

U.S. PATENT DOCUMENTS

| | | | | |
|---|---|---|---|---|
| 2010/0304551 A1* | 12/2010 | Takanashi | ................ | C09D 5/32 |
| | | | | 257/E21.599 |
| 2011/0245367 A1* | 10/2011 | Kurdyumov | ............ | C07F 9/145 |
| | | | | 556/431 |
| 2012/0322233 A1 | 12/2012 | Lei et al. | | |
| 2014/0151328 A1* | 6/2014 | Miyanari | ............ | H01L 21/6835 |
| | | | | 156/247 |
| 2017/0121562 A1* | 5/2017 | Wang | ....................... | C03C 17/32 |
| 2019/0157100 A1* | 5/2019 | Harikai | ................... | H01J 37/00 |

FOREIGN PATENT DOCUMENTS

| | | | |
|---|---|---|---|
| JP | 2008241753 A | * | 10/2008 |
| JP | 2014-523112 A | | 9/2014 |
| WO | WO 2012/173768 A2 | | 12/2012 |

* cited by examiner

*Primary Examiner* — John P. Dulka
(74) *Attorney, Agent, or Firm* — Knobbe Martens Olson & Bear LLP

(57) ABSTRACT

A protective film forming agent for dicing of semiconductor wafers for forming a protective film on the surface of the semiconductor wafers and capable of forming a protective film of high absorbance index, and a production method of semiconductor chips using the protective film forming agent. In a protective film forming agent containing a water-soluble resin, light absorber and solvent, a compound having a specific structure is used as the light absorber. The content of the light absorber in the protective film forming agent is 0.1% by mass or more and 10% by mass or less.

8 Claims, 5 Drawing Sheets

PROTECTIVE FILM FORMING AGENT AND METHOD FOR PRODUCING SEMICONDUCTOR CHIP

This application claims priority to Japanese Patent Application No. 2019-140240 filed Jul. 30, 2019, the entire content of which is incorporated herein by reference.

BACKGROUND OF THE INVENTION

Field of the Invention

The present invention relates to a protective film forming agent and a method for producing semiconductor chips using this protective film forming agent.

Related Art

A wafer formed in a semiconductor device manufacturing process has a laminate in which an insulating film and functional film are laminated on a surface of a semiconductor substrate such as silicon, and is demarcated by a lattice of scheduled division lines called streets. The respective regions demarcated by the streets define semiconductor chips such as IC and LSI.

A plurality of semiconductor chips are obtained by cutting the wafer along these streets. In addition, an optical device wafer has a laminate in which a gallium nitride-based compound semiconductor or the like is laminated, and is demarcated into a plurality of regions by the streets. By cutting along these streets, the optical device wafer is divided into optical devices such as light emitting diodes or laser diodes. These optical devices are widely applied to electronic equipment.

Such cutting along the streets of a wafer has been carried out in the past by a cutting device called a dicer. However, since a wafer having a laminate structure is a highly brittle material, this method has had a problem in that, upon cutting to divide the wafer into semiconductor chips or the like by a cutting blade (cutting edge), scratches or chipping occurs, causing the insulating film required as a circuit element formed on the chip surface to peel.

In order to avoid such flaws, the following method has been proposed (refer to Patent Document 1). Specifically, a mask containing a layer of water-soluble material is first formed on the surface of the semiconductor substrate. Next, a laser is irradiated on the mask to decompose and remove part of the mask, whereby the surface of the semiconductor substrate is exposed at parts of the mask. Subsequently, the semiconductor substrate exposed from the parts of the mask is cut by plasma etching to divide the semiconductor substrate into semiconductor chips (IC).

Patent Document 1: Japanese Unexamined Patent Application (Translation of PCT Application), Publication No. 2014-523112

SUMMARY OF THE INVENTION

In the case of forming a protective film as a mask in the method described in Patent Document 1 or the like, a water-soluble ultraviolet absorber is often used together with a water-soluble resin. However, the water-soluble ultraviolet absorber conventionally used has a low absorbance index at the wavelength of the laser used in dicing. For this reason, it may be necessary to raise the added amount of water-soluble ultraviolet absorber in the protective film forming agent. In the case of adding a large amount of water-soluble ultraviolet absorber to the protective film forming agent, there are problems such as in the solubility of the absorber itself, and a decline in the physical properties of the protective film.

The present invention has been made taking account of the above-mentioned problems, and has an object of providing a protective film forming agent for dicing of semiconductor wafers, used for forming a protective film on the surface of the semiconductor wafers and capable of forming a protective film of high absorbance index, and a production method of semiconductor chips using this protective film forming agent.

The present inventors have found that the above-mentioned problems can be solved by using a compound of a specific structure as a light absorber (B), in a protective film forming agent containing a water-soluble resin (A), light absorber (B) and solvent (S), thereby arriving a completion of the present invention. More specifically, the present invention provides the following.

According to a first aspect of the present invention, in a protective film forming agent to be used for forming a protective film on a surface of a semiconductor wafer in dicing of the semiconductor wafer, the protective film forming agent contains a water-soluble resin (A); a light absorber (B) and a solvent (S), in which the light absorber (B) contains a compound represented by Formula (B1) below,

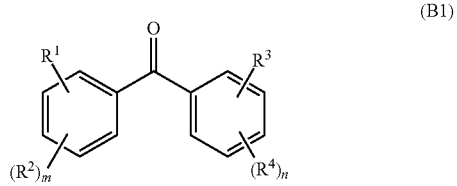

where $R^1$ and $R^3$ are each independently a hydroxyl group or a carboxy group, $R^2$ and $R^4$ are each independently a hydroxyl, carboxy group, or group represented by $-NR^5R^6$, $R^5$ and $R^6$ are each independently a hydrogen atom or an alkyl group having 1 or more and 4 or less carbon atoms, and m and n are each independently an integer of 0 to 2.

According to a second aspect of the present invention, a method for producing a semiconductor chip that processes a semiconductor wafer includes the steps of:
forming a protective film by coating the protective film forming agent as described in the first aspect on the semiconductor wafer; and
irradiating a laser beam on a predetermined position of at least layer containing the protective film on the semiconductor wafer, a surface of the semiconductor wafer being exposed, and then forming a processed groove of a pattern according to a shape of the semiconductor chip.

According to the present invention, it is possible to provide a protective film forming agent for production method of semiconductor chips which produces the semiconductor chips from semiconductor wafers, used for forming a protective film on the surface of the semiconductor wafers and capable of forming a protective film of high absorbance index, and a production method of semiconductor chips using this protective film forming agent

DETAILED DESCRIPTION OF THE INVENTION

«Protective Film Forming Agent»

Figure 1:
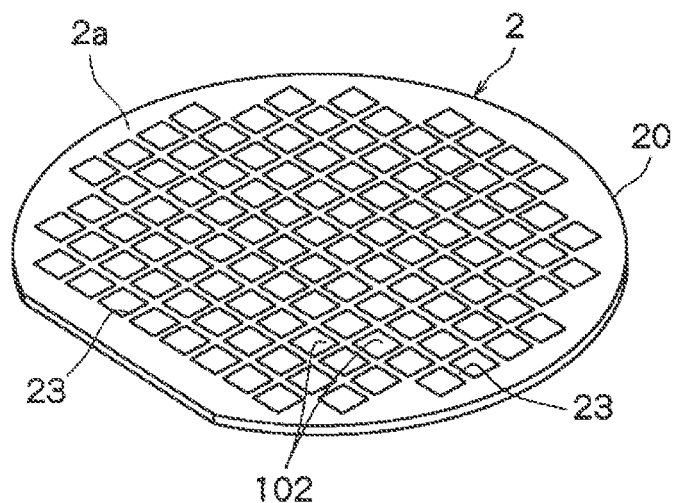
FIG. 1 is a perspective view showing a semiconductor wafer manufactured by a processing method of a wafer using the protective film forming agent of the present invention.

A protective film forming agent can be used in order to form a protective film on the surface of a semiconductor wafer in the dicing of a semiconductor wafer. The protective film forming agent contains a water-soluble resin (A), a light absorber (B) and a solvent (S). Hereinafter, the protective film forming agent is also noted as "protective film forming agent".

More specifically, the protective film forming agent is suitably used in the formation of a protective film in the manufacturing method of semiconductor chips including: irradiating a laser beam on a protective film formed on a semiconductor wafer, the surface of the semiconductor wafer being exposed, and then forming a processed groove of a pattern according to the shape of the semiconductor chip; and irradiating laser or plasma on the semiconductor wafer including the above-mentioned protective film and the above-mentioned processed groove to process the position of the processed groove on the semiconductor wafer.

From the points of the removal of the protective film being easy by water washing after machining of the semiconductor wafer, and in the case of performing plasma irradiation in the manufacturing method of semiconductor chips described later, sufficient durability of the protective film relative to plasma irradiation, typically the film thickness of the protective film is preferably 1 µm or more and 100 µm or less, and more preferably at 10 µm or more and 100 µm or less. 30 µm or more and 100 µm or less is more preferable. In the case of irradiating a laser, the film thickness of the protective film is preferably 0.1 µm or more and 10 µm or less.

Hereinafter, components which are essentially and optionally contained by the protective film forming agent will be explained.

<Water-Soluble Resin (A)>

The water-soluble resin (A) is a substrate of the protective film formed using the protective film forming agent. The type of water-soluble resin is not particular limited so long as being a resin which can form a film by dissolving in a solvent such as water, then coating and drying. Water-soluble refers to at least 0.5 g of the solute (water-soluble resin) dissolving in 100 g of water at 25° C.

The water-soluble resin (A) is preferably a resin which exhibits a weight loss rate of 80% by weight or more in the case of heating up to 500° C. in thermogravimetry. The weight loss rate in the case of heating up to 500° C. is more preferably 90% by weight or more, and even more preferably 95% by weight or more. In the case of using a protective film forming agent containing a water-soluble resin (A) for which the weight loss rate when heating up to 500° C. is within the above-mentioned range, since decomposition of the water-soluble resin (A) favorably progresses from the energy of the laser beam in the protective film, a processed groove that is favorably opened in the protective film tends to form by the irradiation of a laser beam.

The water-soluble resin (A), the weight loss rate when heating up to 350° C. in thermogravimetry is preferably 10% by weight or more, and more preferably 15% by weight or more. In the case of using such a water-soluble resin (A), although the energy amount applied by the laser beam is small, the water-soluble resin (A) tends to favorably decompose, and even in the case of irradiating a low-output laser, a processed groove favorably opening in the protective film tends to be formed.

The thermogravimetry for obtaining the weight loss rate can be performed in accordance with a common thermogravimetry method.

The method for adjusting the weight loss rate of the water-soluble resin (A) is not particularly limited. Generally, so long as being the same type of resin, the weight loss rate of the water-soluble resin (A) will be higher with a smaller average molecular weight.

From the viewpoint of a balance of degradability upon irradiating with a laser beam, and the film forming property, the weight average molecular weight of the water-soluble resin (A) is preferably 15,000 or more and 300,000 or less, and more preferably 20,000 or more and 200,000 or less.

As a specific example for the type of water-soluble resin (A), it is possible to exemplify a vinyl resin, cellulose resin, polyethylene oxide, polyglycerin, water-soluble nylon, etc. The vinyl resin is not particularly limited, so long as being a homopolymer or copolymer of monomers having a vinyl group, and being a water-soluble resin. As the vinyl resin, a polyvinyl alcohol, polyvinyl acetal (including vinyl acetate copolymers), polyvinyl pyrrolidone, polyacrylamide, poly(N-alkyl acrylamide), polyallylamine, poly(N-alkyl allylamine), partially amidated polyallylamine, poly(diallylamine), allylamine-diallylamine copolymer, polyacrylic acid, polyvinyl alcohol polyacrylate block copolymer, and polyvinyl alcohol polyacrylate ester block copolymer can be exemplified. The cellulose resin is not particularly limited so long as being a water-soluble cellulose derivative. As the cellulose resin, methyl cellulose, ethyl cellulose, hydroxypropyl cellulose, etc. can be exemplified. These can be used independently as one type, or can be used by combining two or more types.

Among the above-mentioned specific examples of the water-soluble resin (A), due to shape deterioration, etc. of the processed groove by heat sagging of the protective film hardly occurring, a vinyl resin and cellulose resin are preferable, and polyvinyl pyrrolidone and hydroxypropyl cellulose are more preferable.

The protective film formed on the semiconductor wafer surface normally is removed from the surface of the semiconductor wafer or semiconductor chip, at the appropriate moment after formation of the processed groove, according to the method of processing a semiconductor water including the protective film and processed groove into semiconductor chips. For this reason, a water-soluble resin having low affinity with the semiconductor wafer surface is preferable from the point of water washability of the protective film. As the water-soluble resin having low affinity with the semiconductor wafer surface, a resin having only an ether linkage, hydroxyl group, or amide bond as polar groups, for example, polyvinyl alcohol, polyethylene glycol, polyvinyl pyrrolidine, and hydroxypropyl cellulose, are preferable.

Since opening defects upon forming the processed groove by irradiating a laser beam on the protective film, shape deterioration of the processed groove due to heat sagging of the protective film, etc. hardly occur, the ratio of the mass of water-soluble resin (A) relative to the total amount of the mass of water-soluble resin (A) and mass of light absorber (B) in the protective film forming agent is preferably 60% by mass or more and 99% by mass or less, and more preferably 80% by mass or more and 95% by mass or less.

<Light Absorber (B)>

The protective film forming agent contains a light absorber (B) with the purpose of efficiently absorbing the energy of the laser beam in the protective film, and promoting the thermal decomposition of the protective film. The light absorber (B) contains a compound represented by the following Formula (B1):

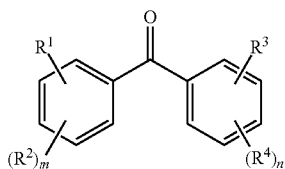
(B1)

(in Formula (B1), $R^1$ and $R^3$ are each independently a hydroxyl group or carboxy group, $R^2$ and $R^4$ are each independently a hydroxyl group, carboxy group or group represented by —$NR^5R^6$, $R^5$ and $R^6$ are each independently a hydrogen atom or alkyl group having 1 or more and 4 or less carbon atoms, and m and n are each independently an integer of 0 or more and 2 or less.)

The compound represented by the above Formula (B1) has a high absorbance index, and exhibits an absorbance index even in the case of adding to the protective film forming agent together with an alkali. For this reason, when forming a protective film using the protective film forming agent containing a compound represented by the above Formula (B1) as the light absorber (B), it is possible to favorably perform partial decomposition by laser of the protective film upon mask formation for dicing.

In the above Formula (B1), $R^2$ and $R^4$ may be a group represented by —$NR^5R^6$. $R^5$ and $R^6$ are each independently a hydrogen atom or an alkyl group having 1 or more and 4 or less carbon atoms. The alkyl group as $R^5$ and $R^6$ may be a straight chain or a branched chain. Specific examples of the alkyl group as $R^5$ and $R^6$ include a methyl group, ethyl group, n-propyl group, isopropyl group, n-butyl group, isobutyl group, sec-butyl group and tert-butyl group.

As the group represented by —$NR^5R^6$, an amino group, methylamino group, ethylamino group, dimethylamino group and diethylamino group are preferable, and an amino group, dimethylamino group and diethylamino group are more preferable.

The compound represented by Formula (B1) is preferably a compound represented by the following Formula (B1-1) due to the height of absorbance index under the presence or absence of a base:

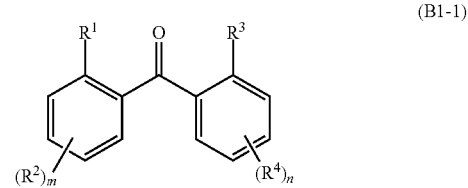
(B1-1)

(in Formula (B1-1), $R^1$ to $R^4$, m and n are the same as those in Formula (B1)).

Based on the height of the absorbance index under the presence or absence of a base, it is preferable for at least one of $R^1$ and $R^3$ to be a hydroxyl group in the above Formula (B1) and Formula (B1-1).

The compound represented by Formula (B1-1) is preferably a compound represented by any of the following Formulas (B1-1a) to (B1-1e):

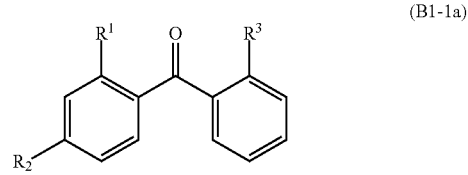
(B1-1a)

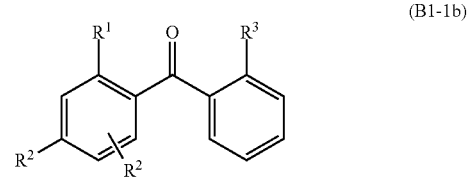
(B1-1b)

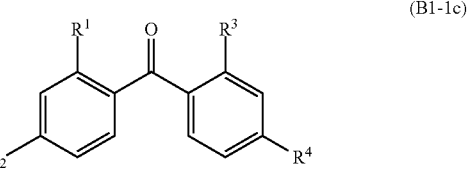
(B1-1c)

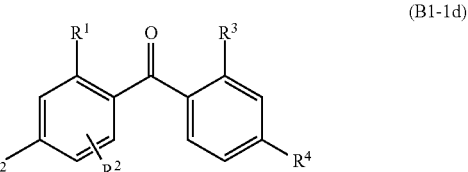
(B1-1d)

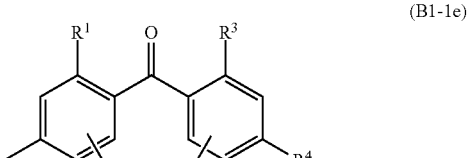
(B1-1e)

(in Formula (B1-1a) to Formula (B1-1e), $R^1$ to $R^4$ are the same as those in Formula (B1)).

Among the compounds represented by Formula (B1-1a) to Formula (B1-1e), compounds represented by Formula (B1-1a) are preferred. In the compounds represented by Formula (B1-1a) to Formula (B1-1e), it is preferable for $R^2$ to be the aforementioned group represented by $-NR^5R^6$, and $R^5$ and $R^6$ to each independently be alkyl groups having 1 or more and 4 or less carbon atoms.
As suitable specific examples of compounds represented by Formula (B1), the following compounds can be exemplified.
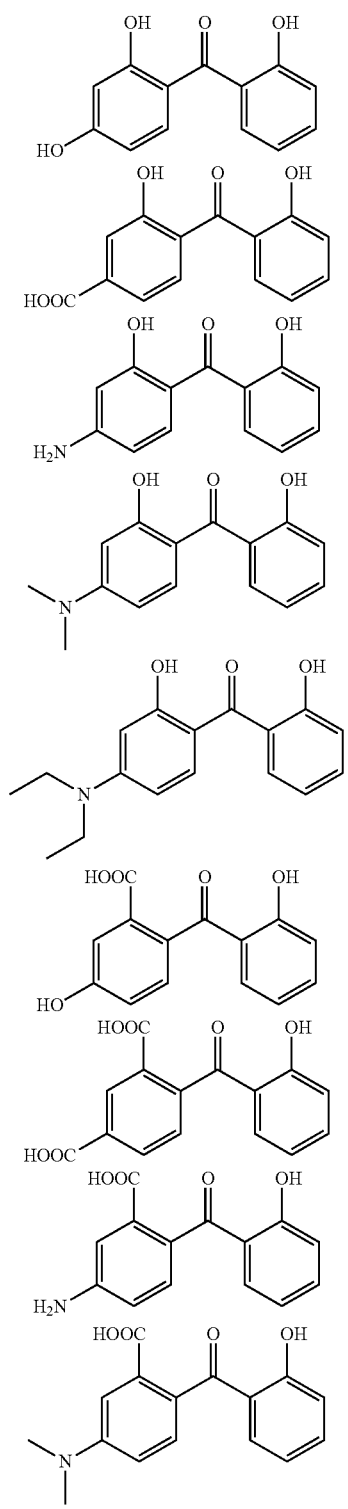
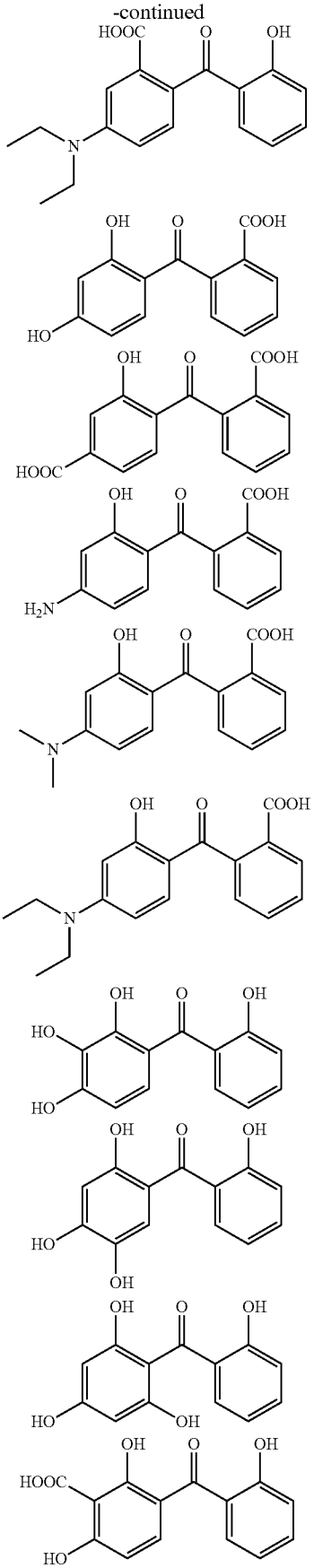

-continued

-continued
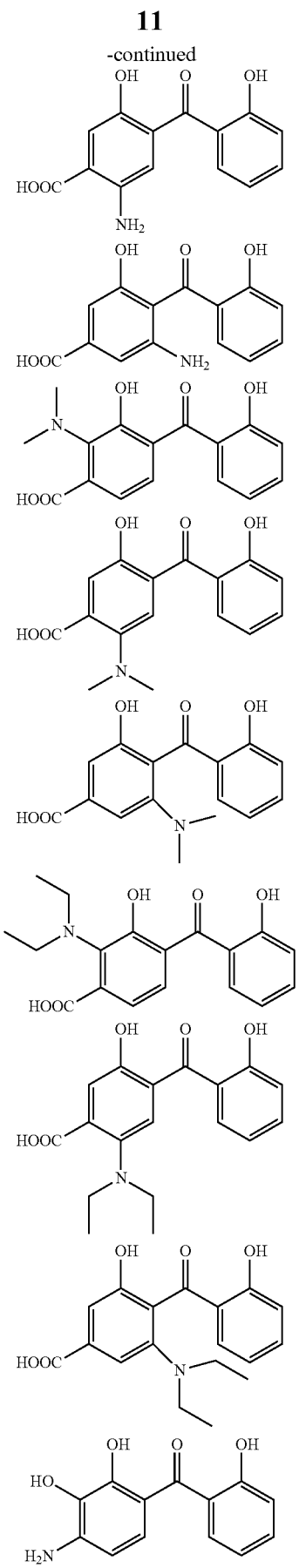
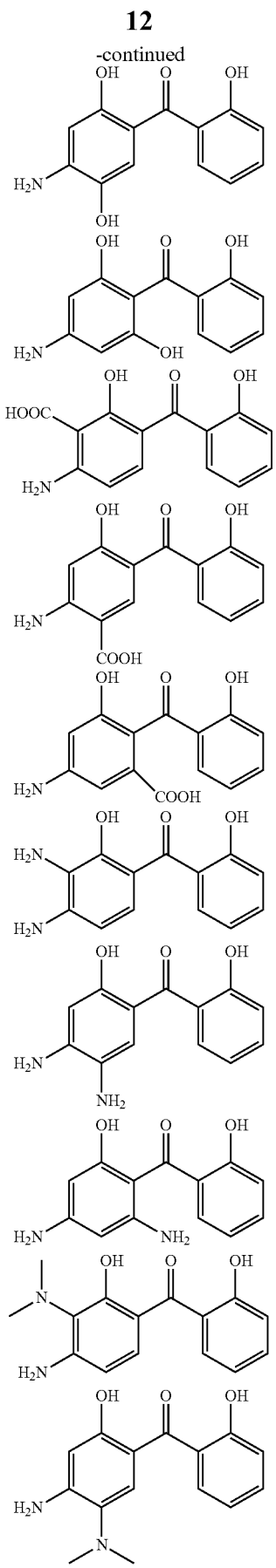

-continued
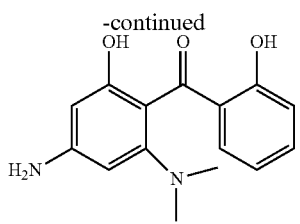
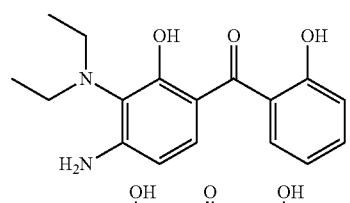
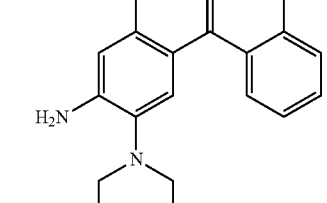
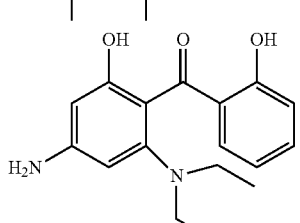
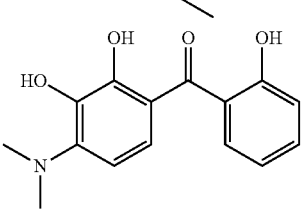
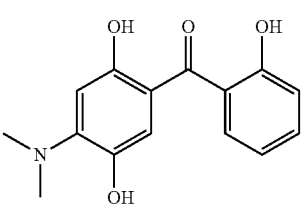
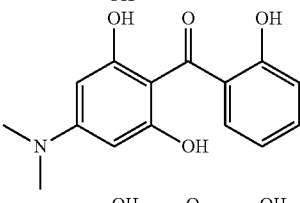
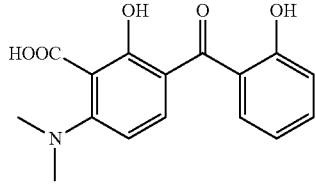
-continued
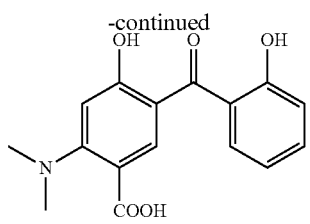
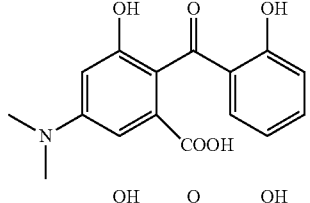
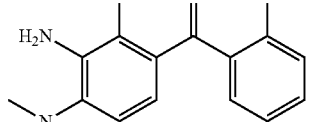
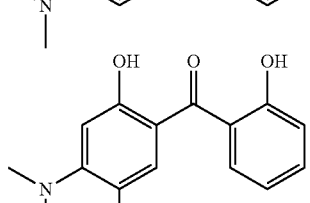
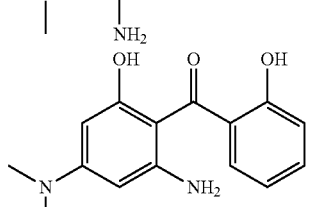
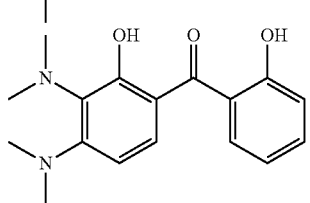
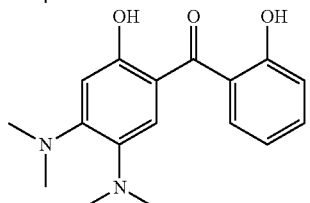
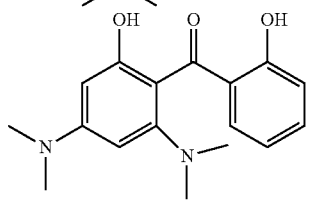
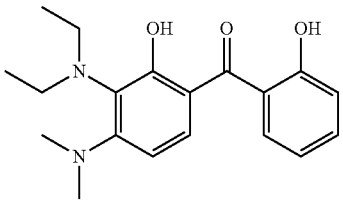

-continued
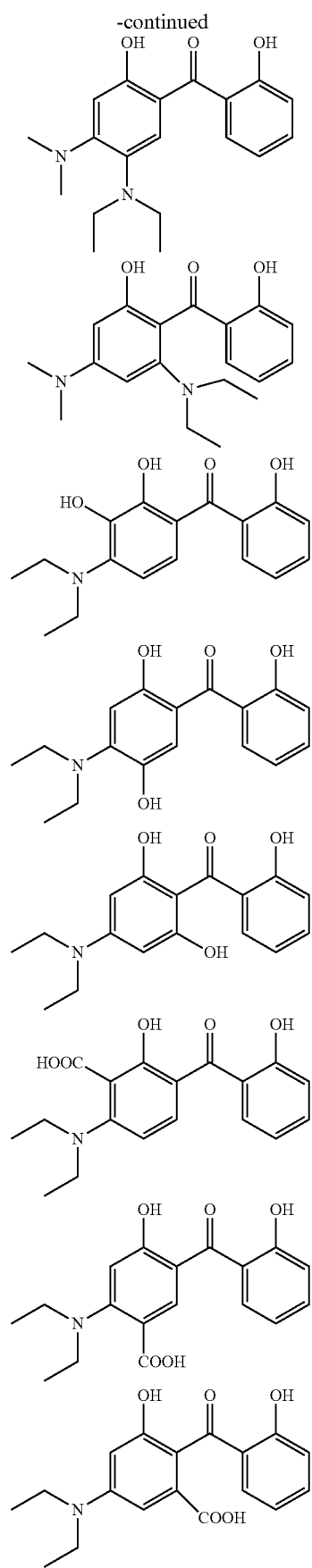
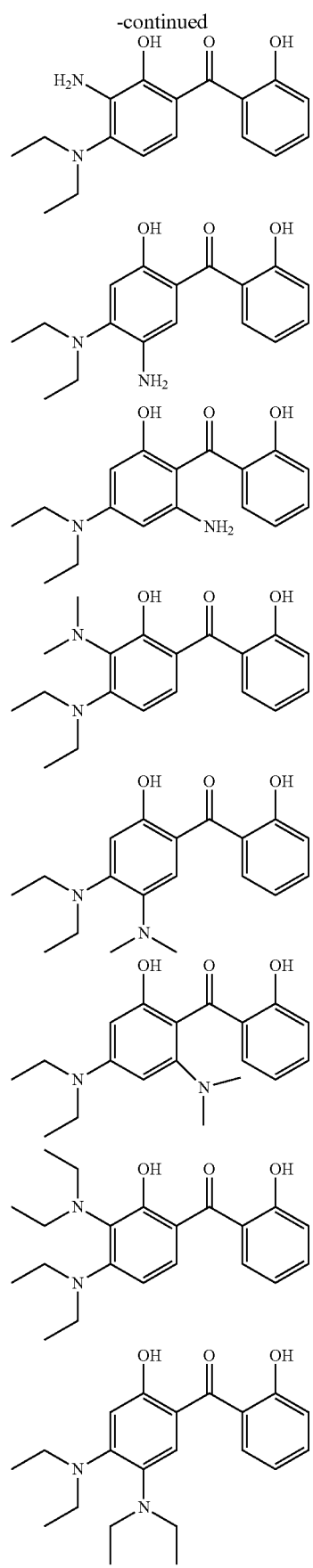

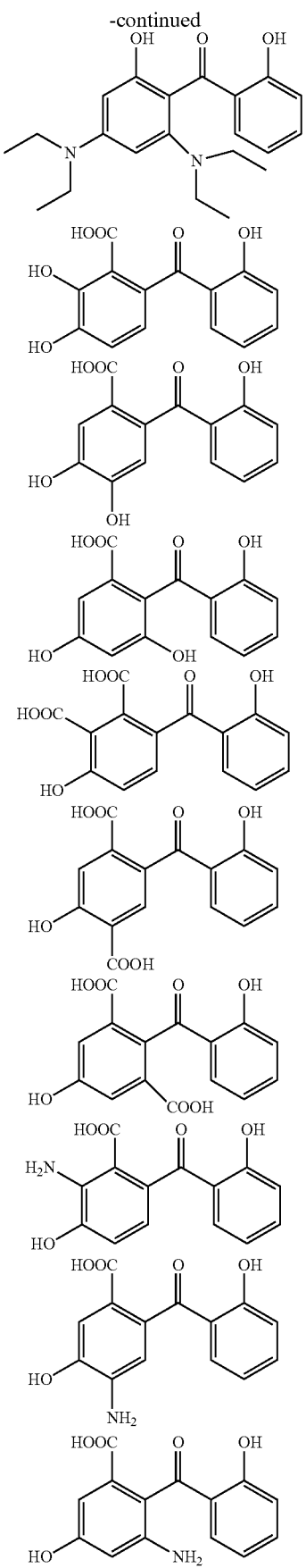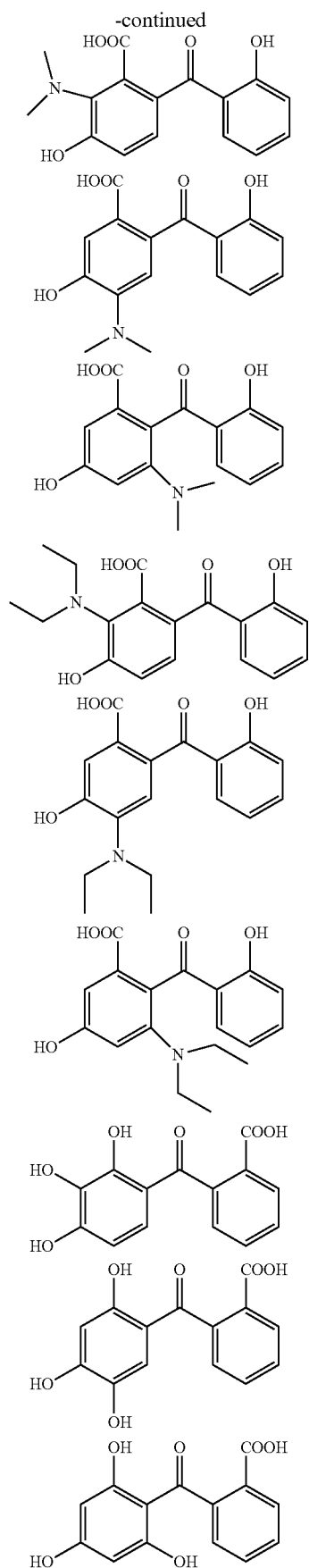

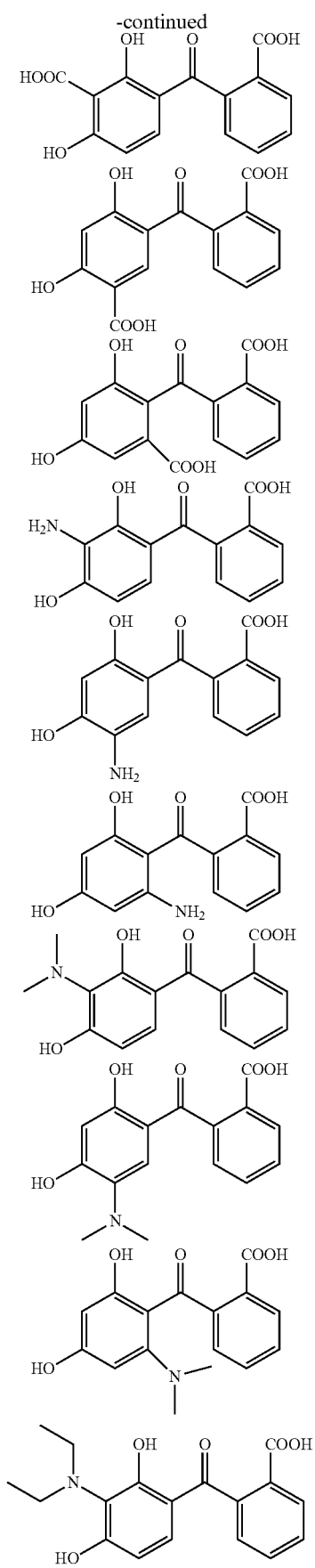
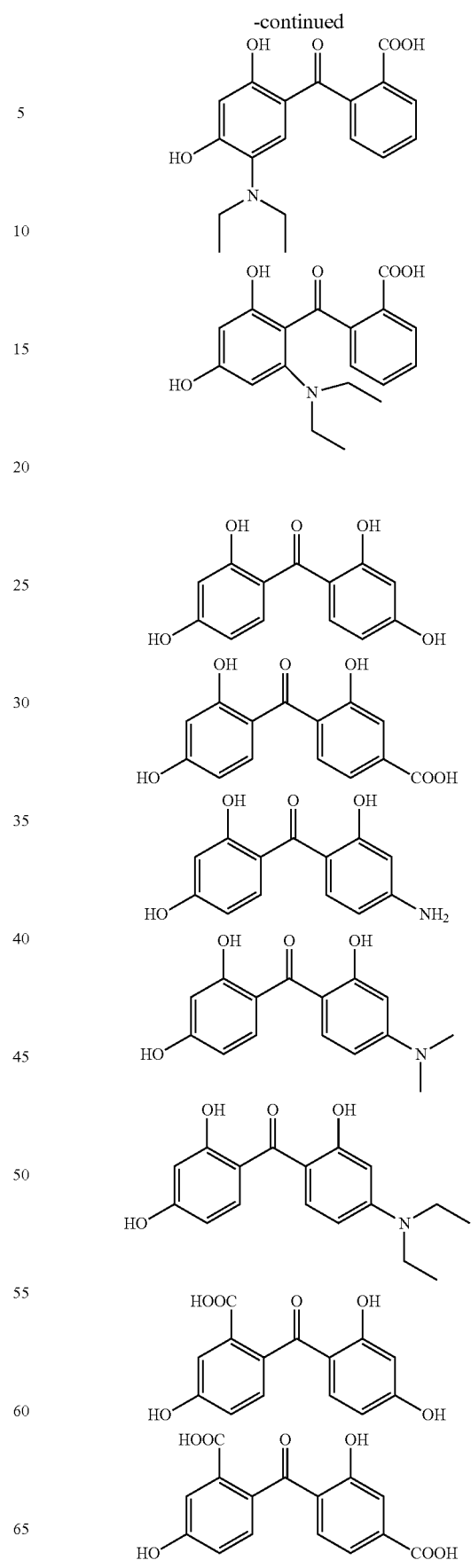

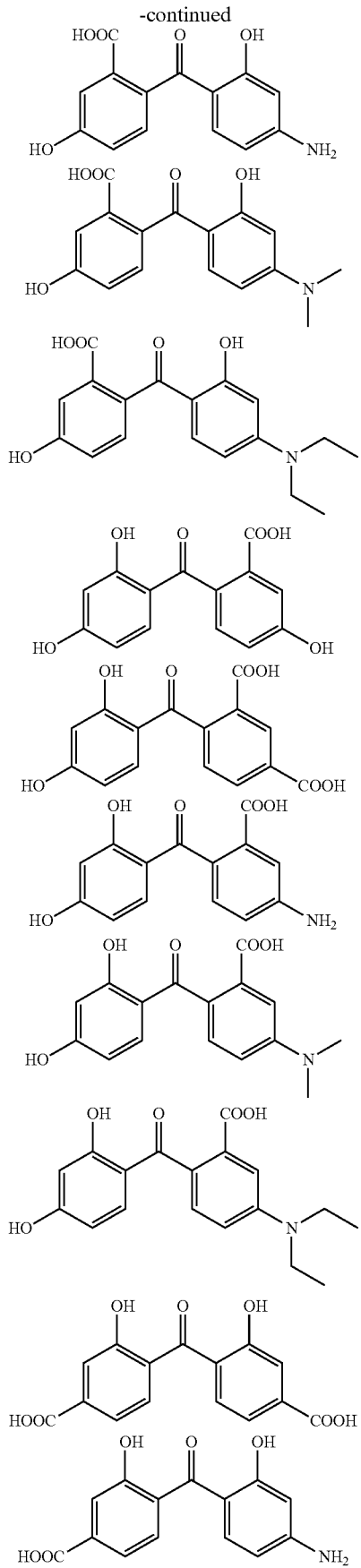
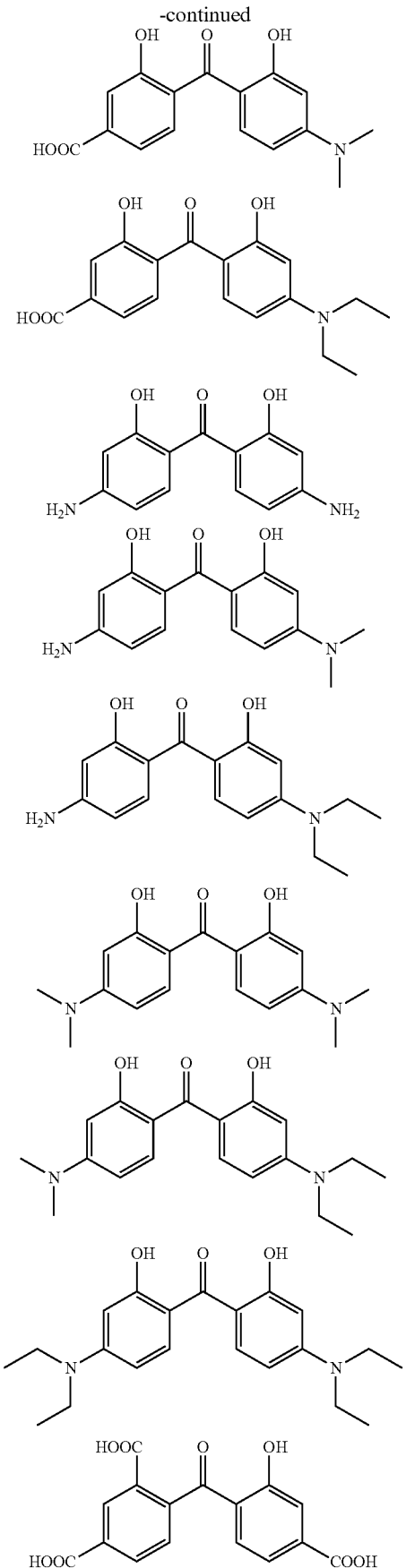

-continued
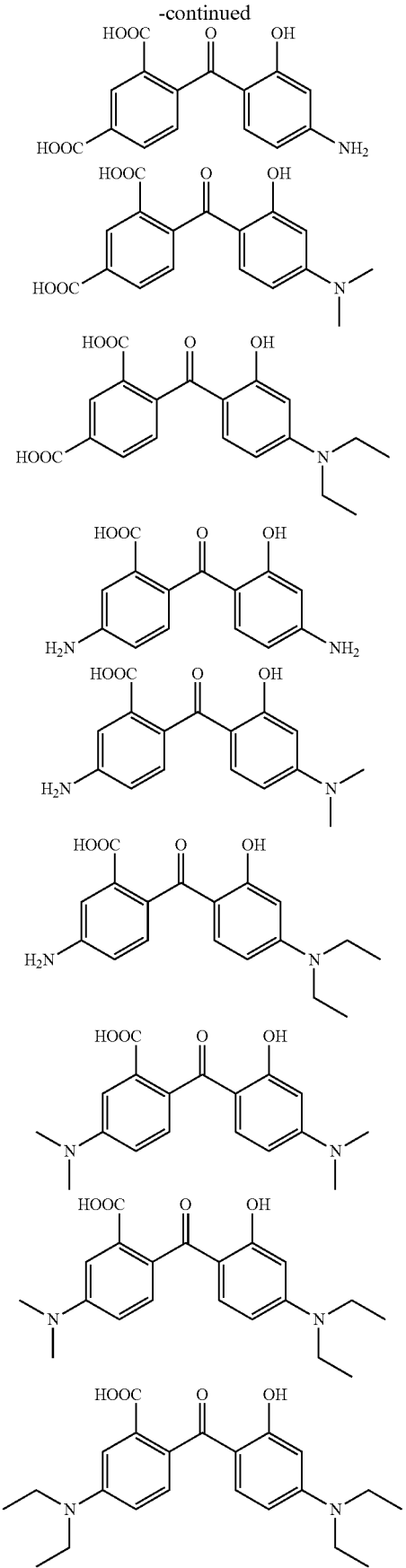
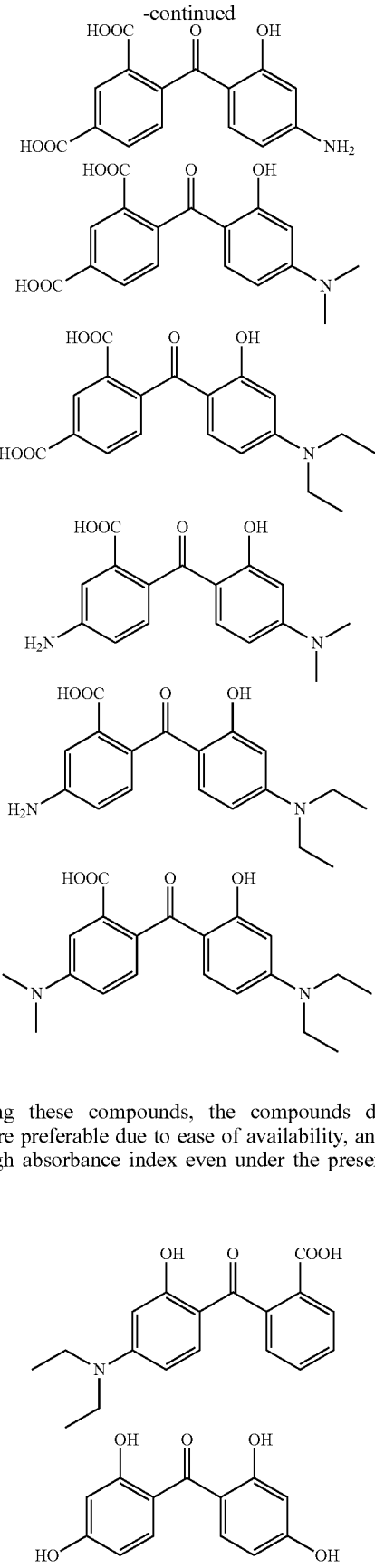
Among these compounds, the compounds described below are preferable due to ease of availability, and exhibiting high absorbance index even under the presence of a base.
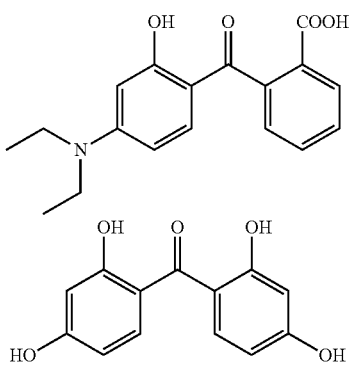

As the light absorber (B), it is possible to use a compound represented by the above Formula (B1), as well as other light absorbers. As the other light absorbers, for example, it is possible to use a water-soluble dye, water soluble pigment, water-soluble ultraviolet absorber, etc. These are all water soluble, and are advantageous upon making present evenly on the protective film. In the case of using a water-soluble light absorber, the storage stability of the protective film forming agent is high, and since flaws such as phase separation of the protective film forming agent and precipitation of the light absorber will not be induced during storage of the protective film forming agent, it is advantageous also in the point of tending to maintain favorable coatability of the protective film forming agent for a long period.

It should be noted that a water insoluble light absorber such as a colorant can also be used. In the case of using a water-insoluble light absorber, although fatal obstacles to use of the protective film forming agent will not arise, variation in the laser absorptivity of the protective film may arise, it may be difficult to obtain a protective film forming agent that excels in storage stability and coatability, and it may be difficult to form a protective film of uniform thickness.

As specific examples of the water-soluble dye, a water-soluble dye is selected from among azo dyes (monoazo and polyazo dyes, metal complex azo dyes, pyrazolone azo dyes, stilbene azo dyes, thiazole azo dyes), anthraquinone dyes (anthraquinone derivatives, anthrone derivatives), indigoid dyes (indigoid derivatives, thioindigoide derivatives), phthalocyanine dyes, carbonium dyes (diphenylmethane dyes, triphenylmethane dyes, xanthene dyes, acridine dyes), quinone imine dyes (azine dyes, oxazine dyes, thiazine dyes), methine dyes (cyanine dyes, azomethine dyes), quinoline dyes, nitroso dyes, benzoquinone and naphthoquinone dyes, naphthalimide dyes, perinone dyes and other dyes.

As the water-soluble pigment, for example, pigments for food additives such as Food Red No. 2, Food Red No. 40, Food Red No. 102, Food Red No. 104, Food Red No. 105, Food Red No. 106, Food Yellow NY, Food Yellow No. 4 tartrazine, Food Yellow No. 5, Food Yellow No. 5 Sunset Yellow FCF, Food Orange AM, Food Vermillion No. 1, Food Vermillion No. 4, Food Vermillion No. 101, Food Blue No. 1, Food Blue No. 2, Food Green No. 3, Food Melon Color B, and Food Egg Color No. 3 are preferred from the viewpoint of environmental load, etc.

As the water-soluble ultraviolet absorber, for example, it is possible to exemplify organic acids such as 4,4'-dicarboxybenzophenone, benzophenone-4-carboxylic acid, 2-carboxyanthraquinone, 1,2-naphthalenedicarboxylic acid, 1,8-naphthalenedicarboxylic acid, 2,3-naphthalenedicarboxylic acid, 2,6-naphthalenedicarboxylic acid, and 2,7-naphthalenedicarboxylic acid, 4-aminocinnamic acid, 3-aminocinnamic acid, 2-aminocinnamic acid, sinapic acid (3,5-dimethoxy-4-hydroxycinnamic acid), ferulic acid, caffeine acid, biphenyl-4-sulfonic acid, 2,6-anthraquinone disulfonic acid, 2,7-anthraquinone disulfonic acid, curcumin and tetrahydroxybenzophenone; sodium salts, potassium salt, ammonium salt, and quaternary ammonium salt of these organic salts; and EAB-F(4,4'-bis(diethylamino) benzophenone. Among these, 4-aminocinnamic acid, 3-aminocinnamic acid, 2-aminocinnamic acid and ferulic acid are preferable, 4-aminocinnamic acid and ferulic acid are more preferable, and 4-aminocinnamic acid is particularly preferable.

The proportion of mass of the compound represented by Formula (B1) relative to the mass of light absorber (B) is not particularly limited in a range not inhibiting the object of the present invention. The proportion of mass of the compound represented by Formula (B1) relative to the mass of light absorber (B) is preferably 70% by mass or more, more preferably 80% by mass or more, even more preferably 95% by mass or more, and particularly preferably 100% by mass.

The content of light absorber (B) in the protective film forming agent is not particularly limited in a range not inhibiting the object of the present invention. The content of light absorber (B) in the protective film forming agent is preferably 0.1% by mass or more and 10% by mass or less. Since opening defects upon forming the processed groove by irradiating a laser beam on the protective film, shape deterioration of the processed groove due to heat sagging of the protective film, etc. hardly occur, the ratio of the mass of light absorber (B) relative to the total amount of the mass of water-soluble resin (A) and mass of light absorber (B) in the protective film forming agent is preferably 1% by mass or more and 50% by mass or less, more preferably 5% by mass or more and 40% by mass or less, and even more preferably 10% by mass or more and no 40% by mass or less.

<Basic Compound (C)>

The protective film forming agent may contain a basic compound (C) for the purpose of facilitating dissolution of the compound represented by Formula (B1). As the basic compound (C), either an inorganic compound or organic compound can be used. As the basic compound (C), an organic compound is preferable. As specific examples of the basic compound (C), it is possible to exemplify basic inorganic compounds such as sodium hydroxide, potassium hydroxide, sodium carbonate, potassium carbonate, sodium silicate, sodium metasilicate and ammonia; and basic organic compounds such as ethylamine, n-propylamine, monoethanolamine, diethylamine, di-n-propylamine, diethanolamine, triethylamine, methyldiethylamine, dimethylethanolamine, triethanolamine, tetramethylammonium hydroxide, tetraethylammonium hydroxide, pyrrole, piperidine, 1,8-diazabicyclo(5,4,0)-7-undecene, and 1,5-diazabicyclo(4,3,0)-5-nonane.

The amount used of the basic compound (C) is not particularly limited in a range not inhibiting the object of the present invention. The amount used of the basic compound (C) relative to 1 mol of the compound represented by Formula (B1), is preferably 1 mol or more, and more preferably 1 mol or more and 20 mol or less. The lower limit for the amount used of the basic compound (C), relative to 1 mol of the compound represented by Formula (B1), may be 1.5 mol or more, may be 2 mol or more, and may be 3 mol or more. The upper limit for the amount used of the basic compound (C), relative to 1 mol of the compound represented by Formula (B1), may be 15 mol or less, may be 10 mol or less, and may be 5 mol or less.

<Other Additives>

The protective film forming agent may contain other compounding agents unless inhibiting the object of the present invention, in addition to the water-soluble resin (A) and light absorber (B). As the other compounding agent, for example, it is possible to use preservatives, surfactants, etc.

As the preservative, it is possible to use benzoic acid, butylparaben, ethylparaben, methylparaben, propylparaben, sodium benzoate, sodium propionate, benzalkonium chloride, benzyl alcohol, cetylpyridinium chloride, chlorobutanol, phenol, phenylethyl alcohol, 2-phenoxyethanol, phenylmercuric nitrate, thimerosal, metacresol, lauryldimethylamine oxide, and combinations of these.

Using a preservative is preferable not only from the point of preservation of the protective film forming agent, but also the point of a load reduction in the processing of waste liquid after semiconductor wafer washing. A large amount of washing water is generally used for washing of semiconductor wafers. However, in the process using the aforementioned protective film forming agent, proliferation of bacteria in the waste liquid is of concern due to the water-soluble resin (A) contained in the protective film forming agent. For this reason, it is desirable for the waste liquid derived from a process using the aforementioned protective film forming agent to be treated separately from the waste liquid derived from a process not using the protective film forming agent. However, in the case of containing a preservative in the protective film forming agent, since the proliferation of bacteria caused by the water-soluble resin (A) is suppressed, the waste liquid derived from the process using the protective film forming agent and the waste liquid derived from a process not using the protective film forming agent can be treated similarly. For this reason, it is possible to reduce the load of waste-water treatment processing.

The surfactant, for example, is used in order to raise the defoaming property during protective film forming agent production, stability of the protective film forming agent, coatability of the protective film forming agent, etc. In particular, it is preferable to use a surfactant in the point of the defoaming property during protective film forming agent production.

A protective film is generally formed by spin coating the protective film forming agent. However, surface irregularities caused by bubbles may occur upon forming the protective film. In order to suppress the occurrence of such surface irregularities, it is preferable to use an anti-foaming agent such as a surfactant.

As the surfactant, a water-soluble surfactant can be used preferably. As the surfactant, any of nonionic surfactant, cationic surfactant, anionic surfactant and amphoteric surfactant can be used. The surfactant may be silicone based. A nonionic surfactant is preferable from the point of washability.

<Solvent (S)>

The protective film forming agent usually contains a solvent (S) for dissolving the water-soluble resin (A) and light absorber (B). As the solvent (S), it is possible to use any of water, organic solvent, and an aqueous solution of organic solvent. In the point of little risk of ignition during use, cost, etc., water and an aqueous solution of organic solvent are preferable as the solvent (S), and water is more preferable.

From the viewpoint of flammability, the content of organic solvent in the solvent (S) is preferably no more than 20% by mass, more preferably no more than 15% by mass, even more preferably no more than 10% by mass, yet more preferably no more than 5% by mass, and particularly preferably no more than 3% by mass.

The solvent (S) is preferably selected so that the protective film forming agent does not have a flash point under 1 atm of pressure. More specifically, by adjusting the content of water in the protective film forming agent, the flash point of the protective film, or presence/absence of a flash point is adjusted. The protective film forming agent without a flash point is safe, for example, and can be left under a non-explosion proof environment. More specifically, it is possible to carry out handling such as storage, transport and use of the protective film forming agent under a non-explosion proof environment. For example, not only the introduction of the protective film forming agent to the semiconductor factory, but also the formation of the protective film can be carried out under a non-explosion proof environment. Therefore, in the point of an explosion proof environment such as a usually expensive explosion proof equipment being unnecessary, the protective film forming agent without a flash point is very advantageous in industry.

The flash point can be obtained by measuring under 1 atm of pressure by the tag closed cup method at a liquid temperature no higher than 80° C., and measured by the Cleveland open cup method at a liquid temperature exceeding 80° C. In the scope of the disclosure and claims of the present application, a case of the flash point not being measurable even when measuring by the Cleveland open cup method is defined as being without a flash point.

As examples of an organic solvent which can be contained in the protective film forming agent, it is possible to exemplify methyl alcohol, ethyl alcohol, alkylene glycol, alkylene glycol monoalkyl ether, alkylene glycol monoalkyl ether acetate and the like. As the alkylene glycol, it is possible to exemplify ethylene glycol, propylene glycol and the like. As the alkylene glycol monoalkyl ether, it is possible to exemplify ethylene glycol monomethyl ether, ethylene glycol monoethyl ether, propylene glycol monomethyl ether, propylene glycol monoethyl ether and the like. As the alkylene glycol monoalkyl ether acetate, it is possible to exemplify ethylene glycol monomethyl ether acetate, ethylene glycol monoethyl ether acetate, propylene glycol monomethyl ether acetate, propylene glycol monoethyl ether acetate and the like. The protective film forming agent may contain a combination of two or more types of organic solvent.

The solid content concentration of the protective film forming agent is not particularly limited in a range not inhibiting the object of the present invention. The solid content concentration, for example, is preferably 5% by mass or more and 60% by mass or less, and more preferably 10% by mass or more and 50% by mass or less.

«Production Method of Semiconductor Chips»

The production method of semiconductor chips is a method including a production of semiconductor chips by processing semiconductor wafers. More specifically, the production method of semiconductor chips is a method including:

forming a protective film by coating the aforementioned protective film forming agent on a semiconductor wafer; and irradiating a laser beam on a predetermined position of at least one layer including the protective film on the semiconductor wafer, the surface of the semiconductor being exposed, and forming a processed groove of a pattern according to a shape of the semiconductor chip. In this method, a laminate semiconductor wafer can be obtained which includes the semiconductor wafer and the protective film on the semiconductor wafer by coating the aforementioned protective film forming agent on the semiconductor wafer to form the protective film. The protective film is normally provided on one main surface of the semiconductor wafer. An insulating film and functional film such as a circuit may be provided between the semiconductor wafer and protective film. Typically, the above-mentioned production method of semiconductor chips includes a cutting process of cutting the position of streets in the semiconductor wafer. Hereinafter, forming a protective film is also noted as "protective film forming step", forming a processed groove is also noted as "processed groove forming step", and cutting the position of a street in the semiconductor wafer is also noted as "cutting step".

<Protective Film Forming Step>

In the protective film forming step, a protective film is formed by coating the aforementioned protective film forming agent on a semiconductor wafer.

The shape of the processed surface of the semiconductor wafer is not particularly limited so long as being able to conduct the desired processing on the semiconductor wafer. Typically, the processed surface of the semiconductor wafer has several surface irregularities. Then, a recessed part in a region corresponding to a street is formed. In the processed surface of the semiconductor wafer, a plurality of regions corresponding to semiconductor chips is demarcated by the streets. In the points of the removal of protective film by washing after processing being easy, and sufficient durability of the protective film to plasma irradiation in the case of performing plasma irradiation in the cutting step described later, typically, the film thickness of the protective film is preferably 1 μm or more and 100 μm or less, and more preferably 10 μm or more and 100 μm or less. It is more preferably 30 μm or more and 100 μm or less. In the case of irradiating a laser in the processed groove forming step and/or cutting step, the film thickness of the protective film is preferably 0.1 μm or more and 10 μm or less. In the cutting step, in the case of performing cutting by a blade, the film thickness of the protective film is not particularly limited. In the case of performing cutting by a blade, since removal of the protective film by washing after processing is easy, the thickness of the protective film is preferably 0.1 μm or more and 100 μm or less, for example.

Hereinafter, a production method of semiconductor chips which performs dicing processing using the aforementioned protective film forming agent on a semiconductor wafer including a plurality of semiconductor chips demarcated by a lattice of streets will be explained as a preferred mode of a production method of the semiconductor chips, while referencing the drawings.

Figure 2:
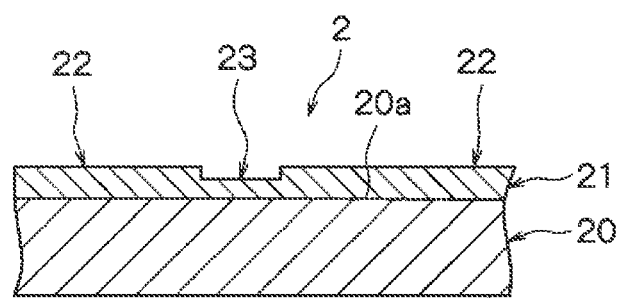
FIG. 2 is a cross-sectional enlarged view of the semiconductor wafer shown in FIG. 1.

FIG. 1 shows a perspective view of a semiconductor wafer which is a processing target. FIG. 2 shows an enlarged cross-sectional view of main parts of the semiconductor wafer shown in FIG. 1. With the semiconductor wafer 2 shown in FIGS. 1 and 2, a laminate 21 in which a functional films forming an insulating film and circuit are laminated is provided on a surface 20a of a semiconductor substrate 20 such as silicon. In the laminate 21, a plurality of semiconductor chips 22 such as IC and LSI is formed in a matrix shape. Herein, the shape and size of the semiconductor chips 22 are not particularly limited, and can be appropriately set according to the design of the semiconductor chip 22.

Each of the semiconductor chips 22 is demarcated by the streets 23 formed in a lattice shape. It should be noted that, in the illustrated embodiment, the insulating film used as the laminate 21 consists of a $SiO_2$ film, or a low-dielectric constant insulating film (Low-k film) consisting of an inorganic film of SiOF, BSC (SiOB) or the like, or an organic film, which is a polymer film such as of polyimide type or parylene type.

The surface of the above-mentioned laminate 21 corresponds to the surface 2a which is the processed surface. The protective film is formed using the aforementioned protective film forming agent on the above-mentioned surface 2a.

In the protective film forming step, for example, the protective film is formed by coating the protective film forming agent on the surface 2a of the semiconductor wafer 2 by spin coating. It should be noted that the coating method of the protective film forming agent is not particular limited so long as being able to form a protective film of the desired film thickness.

Figure 3:
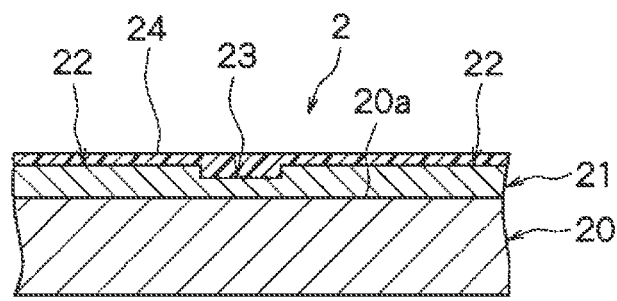
FIG. 3 is an enlarged cross-sectional view of main parts of a semiconductor wafer on which a protective film was formed.

Next, the protective film forming agent of liquid form coating the surface 2a is dried. A protective film 24 is thereby formed on the surface 2a of the semiconductor wafer 2 as shown in FIG. 3.

Figure 4:
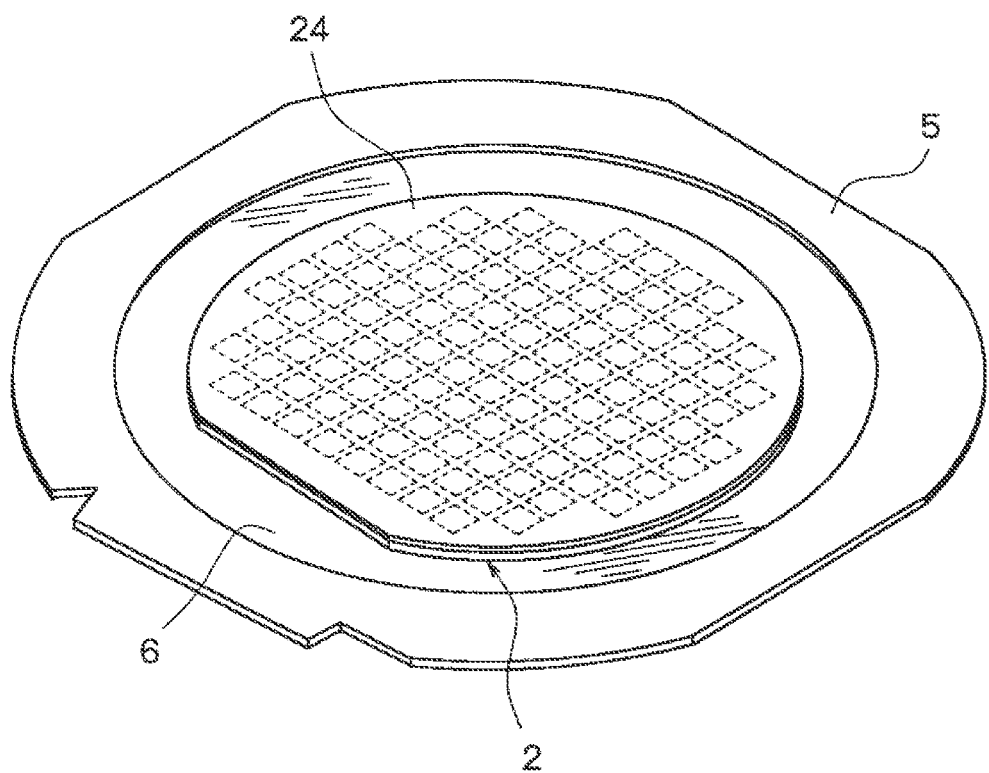
FIG. 4 is a perspective view showing a state in which the semiconductor wafer on which the protective film was formed is supported by an annular frame via protective tape.

After the protective film 24 is formed on the surface 2a of the semiconductor wafer 2 in this way, protective tape 6 put onto an annular frame 5 is pasted to the back surface of the semiconductor wafer 2, as shown in FIG. 4.

<Processed Groove Forming Step>

In the processed groove forming step, a laser beam is irradiated onto a predetermined position of at least one layer including the protective film 24 on the semiconductor wafer 2, the surface 20a of the semiconductor substrate 20 being exposed, whereby the processed groove of a pattern according to the shape of the semiconductor chip 22 is formed.

Figure 5:
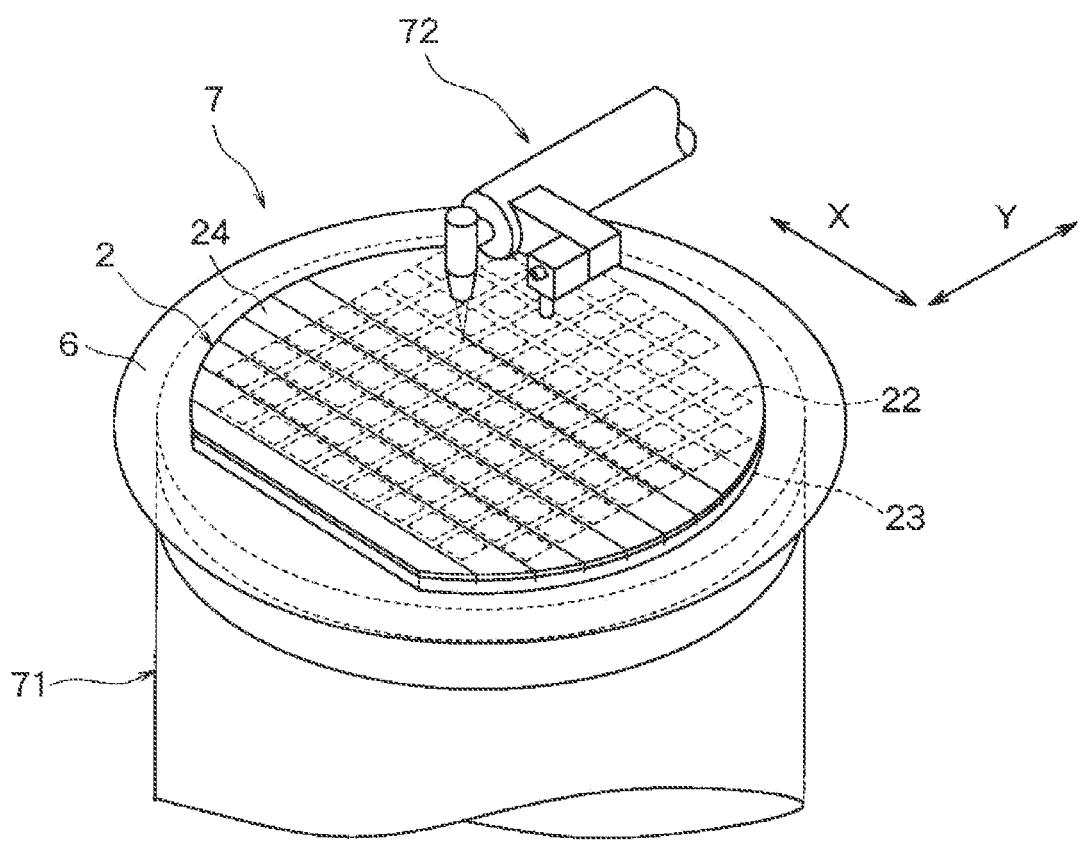
FIG. 5 is a perspective view of main parts of a laser processing device which conducts laser irradiation processing.

More specifically, a laser beam is irradiated through the protective film 24 to the surface 2a (street 23) of the semiconductor wafer 2. Irradiation of this laser beam is carried out using a laser photoirradiation means 72 as shown in FIG. 5. The laser is preferably an ultraviolet laser having a wavelength of 100 nm or longer and 400 nm or shorter from the point of intensity. In addition, a YVO4 laser and YAG laser of 266 nm, 355 nm, etc. wavelength, are preferable.

The above-mentioned laser beam irradiation in the processed groove forming step is performed at the following processing conditions, for example. It should be noted that the focus spot diameter is appropriately selected considering the width of the processed groove 25.

Figure 6:
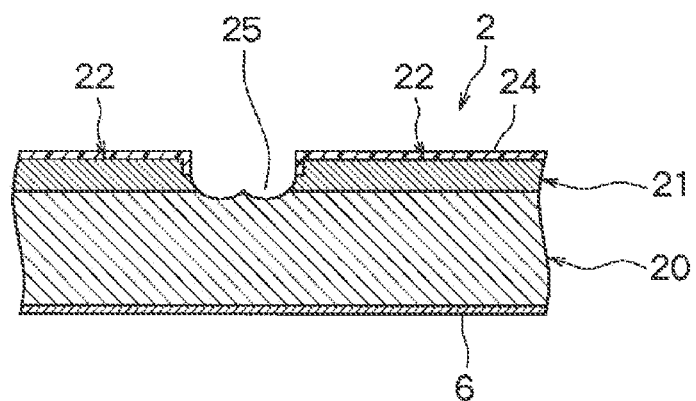
FIG. 6 is a cross-sectional enlarged view of a semiconductor wafer including a processed groove formed by laser beam irradiation.

Light source of laser beam: YVO4 laser or YAG laser
Wavelength: 355 nm
Repetition frequency: 50 kHZ or more and 100 kHZ or less
Output: 0.3 W or more and 4.0 W or less
Process feed rate: 1 mm/s or faster and 800 nm/s or slower By conducting the aforementioned processed groove forming step, the processed groove 25 is formed along the street 23 in the laminate 21 including the street 23 of the semiconductor wafer 2, as shown in FIG. 6. In the case of the protective film 24 containing the aforementioned compound represented by Formula (B1) as the light absorber (B), by irradiating the laser beam as described above on the protective film 24, it is possible to easily form in the protective film 24 a groove having an opening of the desired shape, and cross-section of a favorable shape which is flat and straight.

If executing irradiation of the laser beam along a predetermined street 23 in the aforementioned way, the semiconductor wafer 2 retained on a chuck table 71 is indexed by intervals of the street in the direction indicated by the arrow Y, and irradiation of the laser beam is carried out again.

After carrying out irradiation of the laser beam and indexing of all of the streets 23 extending in a predetermined direction in this way, the semiconductor wafer 2 retained on the chuck table 71 is rotated by 90 degrees, and the irradiation of the laser beam and indexing is executed as described above along each street 23 extending at a right angle relative to the above-mentioned predetermined direction. In this way, it is possible to form the processed groove 25 along all of the streets 23 formed in the laminate 21 on the semiconductor wafer 2.

<Cutting Step>

In the cutting step, the semiconductor wafer 2 including the processed groove 25 at a position corresponding to the position of the street 23 is cut. As a preferred method, it is possible exemplify a method of cutting the semiconductor wafer 2 by irradiating a laser or plasma on the semiconductor wafer 2 including the protective film 24 and processed groove 25, and a method of cutting the semiconductor wafer 2 including the protective film 24 or semiconductor wafer 2 from which the protective film 24 has been peeled, by a blade. In the case of irradiating a laser, the laser is irradiated on the processed groove 25 in order to cut the semiconductor wafer 2. In the case of irradiating plasma, the plasma is irradiated on a part of the surface including the protective film of the semiconductor wafer 2 or the entire surface, so that plasma is exposed to the surface of the processed groove 25. In the case of performing cutting by a blade, the semiconductor wafer 2 is cut by a blade along a position of the processed groove 25, while supplying pure water to the cutting location. Hereinafter, a cutting method by plasma irradiation which is a preferable cutting method will be explained.

Figure 7:
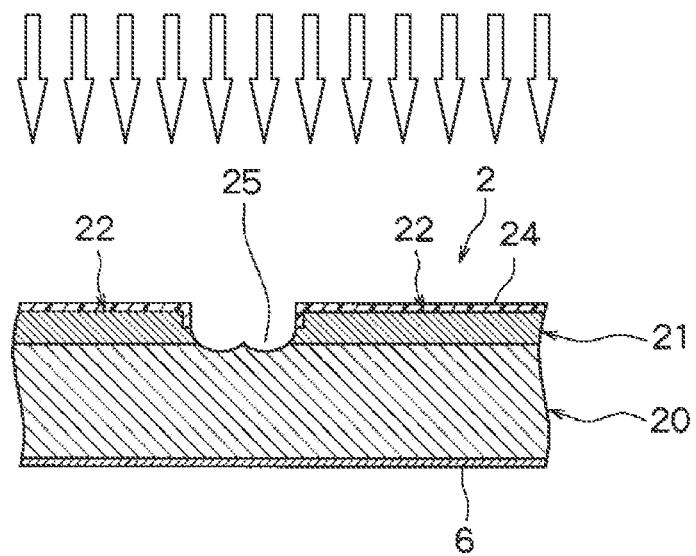
FIG. 7 is an explanatory view showing plasma irradiation on the semiconductor wafer shown in FIG. 6.
Figure 8:
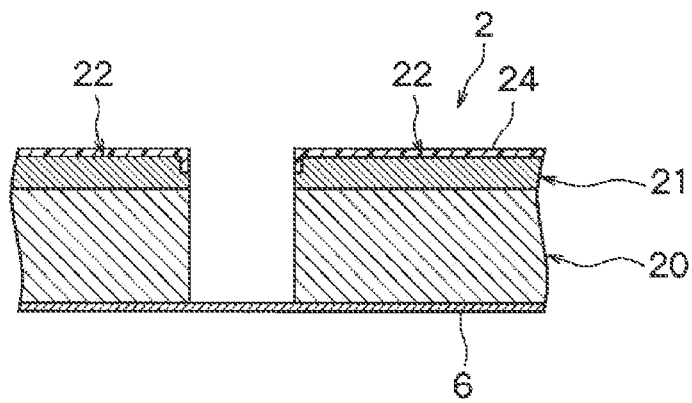
FIG. 8 is a cross-sectional enlarged view showing a state of a semiconductor wafer being divided into semiconductor chips by plasma irradiation.

As shown in FIG. 7, plasma is irradiated onto the semiconductor wafer 2 including the protective film 24 and processed groove 25. By configuring in this way, the position of the processed groove 25 in the semiconductor wafer 2 is cut as shown in FIG. 8. More specifically, in the semiconductor wafer 2 coated by the protective film 24, after forming the processed groove 25 as described above, by performing plasma irradiation on the protective film 24 and surface 20a of the semiconductor substrate 20 exposed from the processed groove 25, the semiconductor wafer 2 is cut following the shape of the semiconductor chips 22, and the semiconductor wafer 2 is divided into the semiconductor chips 22.

The plasma irradiation conditions are not particularly limited so long as being able to favorably perform cutting of the semiconductor wafer 2 at the position of the processed groove 25. The plasma irradiation conditions are appropriately set within a range of common conditions of plasma etching on a semiconductor substrate, considering the material of the semiconductor wafer 2, plasma type and the like. The gas used for generating plasma in the plasma irradiation is appropriately selected according to the material of the semiconductor wafer 2. Typically, $SF_6$ gas is used in the generation of the plasma. In addition, by alternately performing sidewall protection by the supply of $C_4F_6$ or $C_4F_8$ gas, and etching of the semiconductor wafer 2 by plasma irradiation in accordance with the so-called BOSCH process, cutting of the semiconductor wafer 2 may be performed. According to the BOSCH process, etching with a high-aspect ratio is possible, and even in a case of the semiconductor wafer 2 being thick, cutting of the semiconductor wafer 2 is easy.

Figure 9:
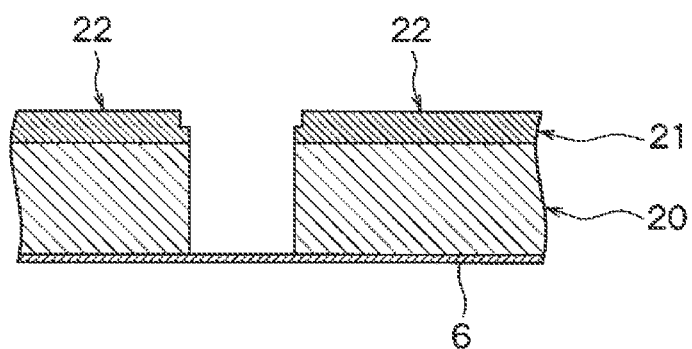
FIG. 9 is a cross-sectional enlarged view showing a state in which a protective film on a semiconductor chip was removed.

Next, as shown in FIG. 9, the protective film 24 covering the surface of the semiconductor chip 22 is removed. As mentioned above, the protective film 24 is formed using the protective film forming agent containing the water-soluble resin (A); therefore, it is possible to wash away the protective film 24 using water (or hot water).

A production method of semiconductor chips by processing a semiconductor wafer has been explained above based on the embodiment. The protective film forming agent and production method of semiconductor chips according to the present invention can be applied to production methods of various semiconductor chips, so long as being a method including the forming of a protective film on the semiconductor wafer surface, and forming a processed groove at a position corresponding to the street in the surface including the protective film of the semiconductor wafer.

EXAMPLES

Hereinafter, the present invention will be explained in detail by way of Examples and Comparative Examples. The present invention is in no way limited to the following examples.

Reference Example 1, Reference Example 2,
Comparative Reference Example 1, and
Comparative Reference Example 2

In Reference Example 1, Reference Example 2, Comparative Reference Example 1, and Comparative Reference Example 2, the following UA1 to UA4 were used as the light absorber. It should be noted that a hydrate of the below compound was used as UA4.

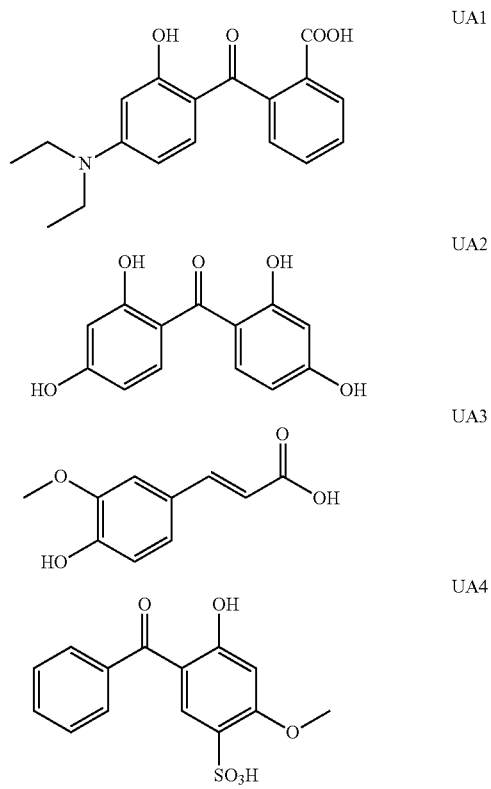

The above-mentioned UA1 to UA4 are dissolved in water together with monoethanolamine as a base so as to have a concentration of 0.001% by mass, and the gram absorbency index was measured at a wavelength of 355 nm for each light absorber. In addition, the above-mentioned UA1 to UA4 were dissolved in propylene glycol monomethyl ether (PGME) so as to make a concentration of 0.001% by mass, and the gram absorbency index was measured at a wavelength of 355 nm for each light absorber. The measurement results of the gram absorbency index are noted in Table 1.

TABLE 1

| | | Gram absorbency index (L/(g · cm)) | |
|---|---|---|---|
| | Light absorber | Aqueous solution (monoethanol amine was added) | PGME solution |
| Reference Example 1 | UA1 | 103.8 | 154.9 |
| Reference Example 2 | UA2 | 95.9 | 91.9 |
| Comparative reference example 1 | UA3 | 29.4 | 12.5 |
| Comparative reference example 2 | UA4 | 12.1 | 12.1 |

From Table 1 it is found that UA1 and UA2 having a structure corresponding to the structure of the Formula (B1) exhibit high gram absorbency index.

Example 1, Example 2, Comparative Example 1 and Comparative Example 2

In 90 parts by mass of water, 8.5 parts by mass of hydroxypropyl cellulose as the water-soluble resin, 1 part by mass of light absorber of the type listed in Table 2, and 0.5 parts by mass of monoethanolamine were dissolved to obtain protective film forming agents of the respective Examples and Comparative Examples. Using the obtained protective film forming agent, a protective film was formed by a spin coating method so as to make a film thickness of 1 μm on a glass substrate. On the formed protective films, the measurement of transmissivity was performed using a spectrophotometer (MCPD-300 (manufactured by Otsuka Electronics Co. Ltd.), and the absorbance per 1 μm thickness at a wavelength of 355 nm was measured from the measurement results of the transmissivity. The measurement results are noted in Table 2.

TABLE 2

|  | Light absorber | Absorbance index (/μm) |
| --- | --- | --- |
| Example 1 | UA1 | 1.3 |
| Example 2 | UA2 | 0.9 |
| Comparative example 1 | UA3 | 0.3 |
| Comparative example 2 | UA4 | 0.2 |

From Table 2 it is found that it is possible to form a protective film of high absorbance using the protective film forming agent containing UA1 and UA2 having a structure corresponding to the structure of the Formula (B1).

Example 3, Comparative Example 3 and Comparative Example 4

In 59.5 parts by mass of water, 26.25 parts by mass of hydroxypropyl cellulose as the water-soluble resin, 3 parts by mass of light absorber of the types listed in Table 3 and 0.75 parts by mass of monoethanolamine were dissolved to obtain the protective film forming agents of the respective Examples and Comparative Examples. It should be noted that 4-aminocinnamic acid was used as UA5.

After coating the obtained protective film forming agents by way of a spin coating method so as to make a film thickness of 30 μm on a silicon substrate, it was dried for 5 minutes at 70° C. to form a protective film. Laser irradiation was performed linearly at the below conditions on the surface on the protective film side of the silicon substrate including the protective film, the cross-sectional shape at the location irradiated by laser of the protective film was observed by electron microscope, and then evaluated according to the evaluation criteria described later.

<Laser Irradiation Conditions>
Wavelength: 355 nm
Frequency: 100 kHz
Output: 0.3 W
Defocus: −0.5 mm
Feed rate: 100 mm/s
Pass: 3

<Cross-Sectional Shape Evaluation Criteria>
Good: cross-section of protective film is flat, straight and clean groove was formed
Fair: response to cross-section of protective film stands out, and groove having unfavorable shape was formed
Bad: formation of groove itself was difficult

TABLE 3

|  | Light absorber | Cross-sectional shape of protective film irradiated by laser |
| --- | --- | --- |
| Example 3 | UA1 | Good |
| Comparative example 3 | UA3 | Bad |
| Comparative example 4 | UA5 | Fair |

From Table 3 it was found that, in the case of irradiating a laser on the protective films formed using the protective film forming agent containing UA1 having a structure corresponding to the structure of the Formula (B1), a groove having favorable cross-sectional shape could be easily formed at a position corresponding to the street of the protective film.

EXPLANATION OF REFERENCE NUMERALS 2 semiconductor wafer
20 substrate
21 laminate
22 semiconductor chip
23 street
24 protective film
25 laser processed groove
26 cut groove
3 spin coater
5 annular frame
6 protective tape
7 laser processing device
71 chuck table of laser processing device
72 laser beam irradiation means

What is claimed is:
1. A protective film forming agent for forming a protective film on a surface of a semiconductor wafer in dicing of the semiconductor wafer, the protective film forming agent comprising:
a water-soluble resin (A); a light absorber (B) and a solvent (S),
wherein the light absorber (B) contains a compound represented by Formula (B1) below,

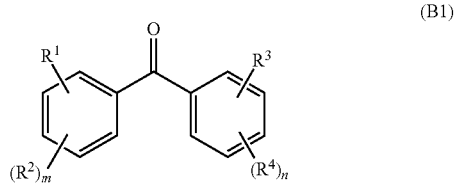

(B1)

wherein $R^1$ and $R^3$ are each independently a hydroxyl group or a carboxy group, $R^2$ and $R^4$ are each independently a hydroxyl, carboxy group, or group represented by $-NR^5R^6$, $R^5$ and $R^6$ are each independently a hydrogen atom or an alkyl group having 1 or more and 4 or less carbon atoms, and m and n are each independently an integer of 0 or more and 2 or less.

2. The protective film forming agent according to claim 1, wherein the compound represented by Formula (B1) is a compound represented by Formula (B1-1) below, (B1-1)

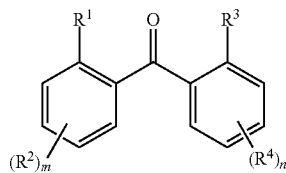

wherein $R^1$ to $R^4$, m and n are respectively the same as in Formula (B1).

3. The protective film forming agent according to claim 2, wherein at least one of the $R^2$ and the $R^3$ is a hydroxyl group.

4. The protective film forming agent according to claim 3, wherein the compound represented by Formula (B1-1) is a compound represented by any of Formula (B1-1a) to Formula (B1-1e) below, (B1-1a)

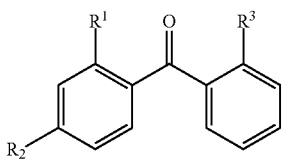

(B1-1b)

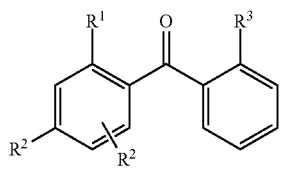

(B1-1c)

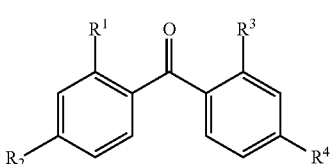

-continued (B1-1d)

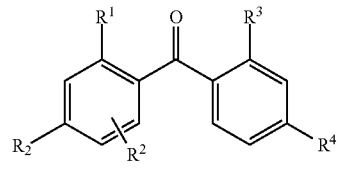

(B1-1e)

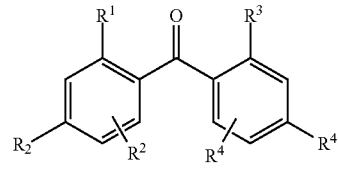

wherein $R^1$ to $R^4$ are respectively the same as in Formula (B1).

5. The protective film forming agent according to claim 4, wherein the compound represented by Formula (B1-1) is a compound represented by the Formula (B1-1a),
wherein the $R^2$ is the group represented by —$NR^5R^6$, and
wherein the $R^5$ and the $R^6$ are each independently an alkyl group having 1 or more and 4 or less carbon atoms.

6. The protective film forming agent according to claim 1, wherein content of the light absorber (B) is 0.1% by mass or more and 10% by mass or less.

7. The protective film forming agent according to claim 1, wherein the protective film forming agent has no flash point under 1 atmosphere of pressure.

8. A method for producing a semiconductor chip by processing a semiconductor wafer, the method comprising:
   forming a protective film by coating the protective film forming agent according to claim 1 on the semiconductor water; and
   irradiating a laser beam on a predetermined position of at least layer containing the protective film on the semiconductor wafer, wherein a surface of the semiconductor wafer is exposed, and then forming a processed groove of a pattern according to a shape of the semiconductor chip.

* * * * *

UNITED STATES PATENT AND TRADEMARK OFFICE
CERTIFICATE OF CORRECTION

PATENT NO. : 11,407,063 B2
APPLICATION NO. : 16/935819
DATED : August 9, 2022
INVENTOR(S) : Tetsuro Kinoshita It is certified that error appears in the above-identified patent and that said Letters Patent is hereby corrected as shown below:

In the Specification

Column 2, Line 48, Delete "water;" and insert -- wafer; --.

Column 2, Line 60, Delete "agent" and insert -- agent. --.

Column 4, Line 67, Delete "water" and insert -- wafer --.

In the Claims

Column 35, Line 14 (Claim 3), Delete "$R^2$" and insert -- $R^1$ --.

Column 36, Line 34 (Claim 8), Delete "water;" and insert -- wafer; --.

Signed and Sealed this
Twentieth Day of December, 2022

Katherine Kelly Vidal
*Director of the United States Patent and Trademark Office*